US012591285B2

(12) United States Patent
Keiper, III et al.

(10) Patent No.: US 12,591,285 B2
(45) Date of Patent: *Mar. 31, 2026

(54) HIGHLY ADAPTABLE POWER SYSTEM

(71) Applicant: Astrodyne TDI, Hackettstown, NJ (US)

(72) Inventors: Vincent G. Keiper, III, Pen Argyl, PA (US); Gary J. Mulcahy, Flanders, NJ (US)

(73) Assignee: ASTRODYNE TDI, Hackettstown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/652,902

(22) Filed: May 2, 2024

(65) Prior Publication Data

US 2024/0288918 A1      Aug. 29, 2024

Related U.S. Application Data

(63) Continuation of application No. 17/248,598, filed on Jan. 29, 2021, now Pat. No. 11,977,425.

(51) Int. Cl.
| | |
|---|---|
| *G06F 1/26* | (2006.01) |
| *G06F 1/28* | (2006.01) |
| *G06F 13/42* | (2006.01) |
| *H05K 7/14* | (2006.01) |
| *G06F 8/65* | (2018.01) |

(52) U.S. Cl.
CPC .................. *G06F 1/26* (2013.01); *G06F 1/28* (2013.01); *G06F 13/4282* (2013.01); *H05K 7/1495* (2013.01); *G06F 8/65* (2013.01)

(58) Field of Classification Search
CPC ... G06F 1/26; G06F 1/263; G06F 1/28; G06F 1/30; G06F 1/305; G06F 1/3203; G06F 1/3243; G06F 1/325; G06F 1/3293; G06F 1/3296; G06F 8/65; G06F 13/4282; H05K 7/1495
See application file for complete search history.

(56) References Cited

U.S. PATENT DOCUMENTS

| | | | |
|---|---|---|---|
| 8,051,316 B2 | 11/2011 | Roberts et al. | |
| 10,424,938 B2 | 9/2019 | Guo et al. | |
| 10,559,962 B2 | 2/2020 | Huang et al. | |
| 11,977,425 B2 * | 5/2024 | Keiper, III | .............. G06F 1/266 |
| 2008/0120567 A1 | 5/2008 | Karstens | |
| 2008/0320322 A1 | 12/2008 | Green | |
| 2009/0199021 A1 | 8/2009 | Chu et al. | |
| 2009/0206804 A1 | 8/2009 | Xu et al. | |
| 2011/0173470 A1 | 7/2011 | Tran | |
| 2013/0076381 A1 | 3/2013 | Takayanagi et al. | |
| 2013/0149954 A1 * | 6/2013 | North | ................. H05K 7/20745 454/184 |

(Continued)

*Primary Examiner* — Thomas J. Cleary
(74) *Attorney, Agent, or Firm* — Boisbrun Hofman, PLLC

(57) ABSTRACT

A power system and method of operating the same. In one embodiment, the power system includes a plurality of power converters configured to power a host system. The power system also includes a power converter controller configured to provide a status of and control the plurality of power converters and at least one system element of the host system responsive to a plurality of host system signals. The control includes a scripted sequence of events as function of a change of an operational condition of at least one of the plurality of power converters and the host system.

20 Claims, 8 Drawing Sheets

(56)          References Cited

U.S. PATENT DOCUMENTS

| | | |
|---|---|---|
| 2015/0177814 A1 | 6/2015 | Bailey et al. |
| 2018/0107258 A1* | 4/2018 | Remis ........................ G06F 8/65 |
| 2018/0215557 A1* | 8/2018 | Archer ................. B65G 57/305 |
| 2019/0272012 A1 | 9/2019 | Kachare et al. |
| 2020/0125159 A1 | 4/2020 | Messick et al. |
| 2020/0183725 A1* | 6/2020 | Grehan ................. G06F 3/0664 |
| 2022/0244766 A1 | 8/2022 | Keiper et al. |

* cited by examiner

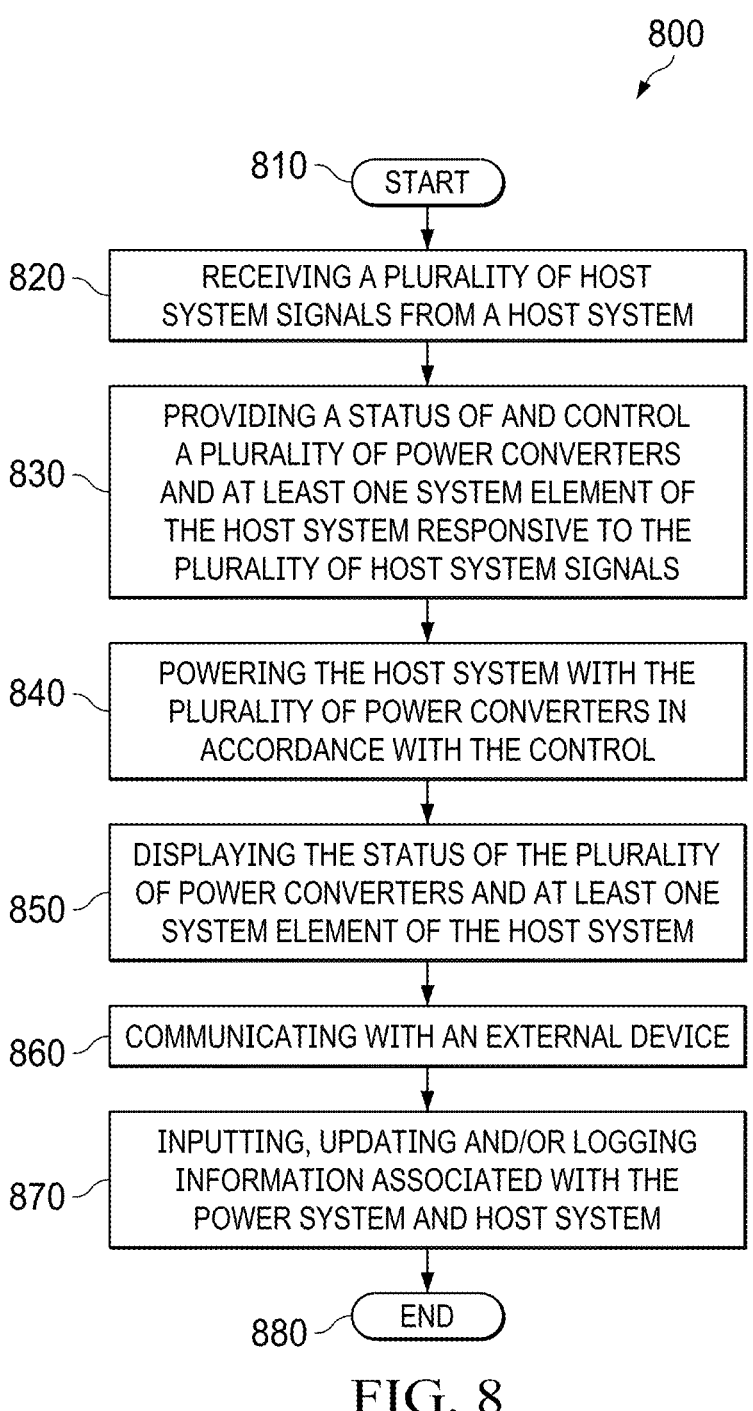

800

810 — START

820 — RECEIVING A PLURALITY OF HOST SYSTEM SIGNALS FROM A HOST SYSTEM

830 — PROVIDING A STATUS OF AND CONTROL A PLURALITY OF POWER CONVERTERS AND AT LEAST ONE SYSTEM ELEMENT OF THE HOST SYSTEM RESPONSIVE TO THE PLURALITY OF HOST SYSTEM SIGNALS

840 — POWERING THE HOST SYSTEM WITH THE PLURALITY OF POWER CONVERTERS IN ACCORDANCE WITH THE CONTROL

850 — DISPLAYING THE STATUS OF THE PLURALITY OF POWER CONVERTERS AND AT LEAST ONE SYSTEM ELEMENT OF THE HOST SYSTEM

860 — COMMUNICATING WITH AN EXTERNAL DEVICE

870 — INPUTTING, UPDATING AND/OR LOGGING INFORMATION ASSOCIATED WITH THE POWER SYSTEM AND HOST SYSTEM

880 — END

FIG. 8

HIGHLY ADAPTABLE POWER SYSTEM

RELATED APPLICATION

This application is a continuation of U.S. patent application Ser. No. 17/248,598, filed on Jan. 29, 2021, and issued on May 7, 2024 as U.S. Pat. No. 11,977,425 entitled "Highly Adaptable Power System," which is incorporated herein by reference.

This application is related to U.S. patent application Ser. No. 18/499,113 currently pending, filed on Oct. 31, 2023, entitled "Control of Electronic Heaters," which is incorporated herein by reference.

FIELD OF THE INVENTION

The present invention is directed, in general, to power electronics and, more particularly, to a power system including a plurality of power converters to power a host system.

BACKGROUND

A power system including a plurality of power converters is often implemented to power a host system, whereby converter output power is monitored and controlled to realize host system functionality. Real-time control of parameters such as a delivered voltage and/or a current to high degrees of precision may be important for host system processes to be fulfilled. Likewise, telemetry regarding delivered power can be important to system control and successful operation. In addition to functions directly related to power delivery, many times it may be beneficial for other host system functions not directly tied to power conversion, such as safety controls, environmental monitoring, and user information portals to be co-located with a power system controller.

Historically, power system control has been realized with analog circuitry. However, modern systems typically utilize high speed digital communications to enhance or optimize a control interface. System internal communication protocols and/or standards can vary, where typical protocols, standards and/or computer connectivity include Ethernet, Ethercat, Profinet, control area network bus ("CANbus"), RS232, I-squared C ("I2C"), universal serial bus ("USB"), or others.

Common practice within the power electronics industry is to provide one or two interfaces at the individual converter level, or per small groups of converters. However, when a power system employs numerous points of conversion, a control interface can become overly complicated and inefficient. Likewise, typical power system controllers are focused solely on power conversion, with no facility to monitor and control parameters beyond the power converter assembly.

What is needed in the art is a power system that anticipates highly complex systems with a multitude of outputs, provides high precision and extremely low latency, simplifies system wiring and interconnect, provides the ability to monitor and control parameters outside the power converter system, along with adaptability to numerous host protocols and/or standards.

SUMMARY

These and other problems are generally solved or circumvented, and technical advantages are generally achieved, by advantageous embodiments of the present invention for a highly adaptable power system and methods of operating the same. In one embodiment, the power system includes a plurality of power converters configured to power a host system. The power system also includes a power converter controller configured to provide a status of and control the plurality of power converters and at least one system element of the host system responsive to a plurality of host system signals. The control includes a scripted sequence of events as function of a change of an operational condition of at least one of the plurality of power converters and the host system.

The foregoing has outlined rather broadly the features and technical advantages of the present invention in order that the detailed description of the invention that follows can be better understood. Additional features and advantages of the invention will be described hereinafter, which form the subject of the claims of the invention. It should be appreciated by those skilled in the art that the conception and specific embodiment disclosed can be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in connection with the accompanying drawings, and which:

FIG. 8 illustrates a flow diagram of an embodiment of a method of operating a power system.

Corresponding numerals and symbols in the different figures generally refer to corresponding parts unless otherwise indicated, and cannot be redescribed in the interest of brevity after the first instance. The FIGURES are drawn to illustrate the relevant aspects of exemplary embodiments.

DETAILED DESCRIPTION

The making and using of the present exemplary embodiments are discussed in detail below. It should be appreciated, however, that the embodiments provide many applicable inventive concepts that can be embodied in a wide variety of specific contexts. The specific embodiments discussed are merely illustrative of specific ways to make and use the systems, subsystems, and modules for the design of a power system configured to provide a status of and control for a plurality of power converters and at least one system element of a host system. The specific embodiments include, but are not limited to, a plurality of power converters configured to provide power and control signals for a host system. The principles of the present invention are applicable to other designs of a host system powered and controlled by a plurality of power converters.

Figure 1:
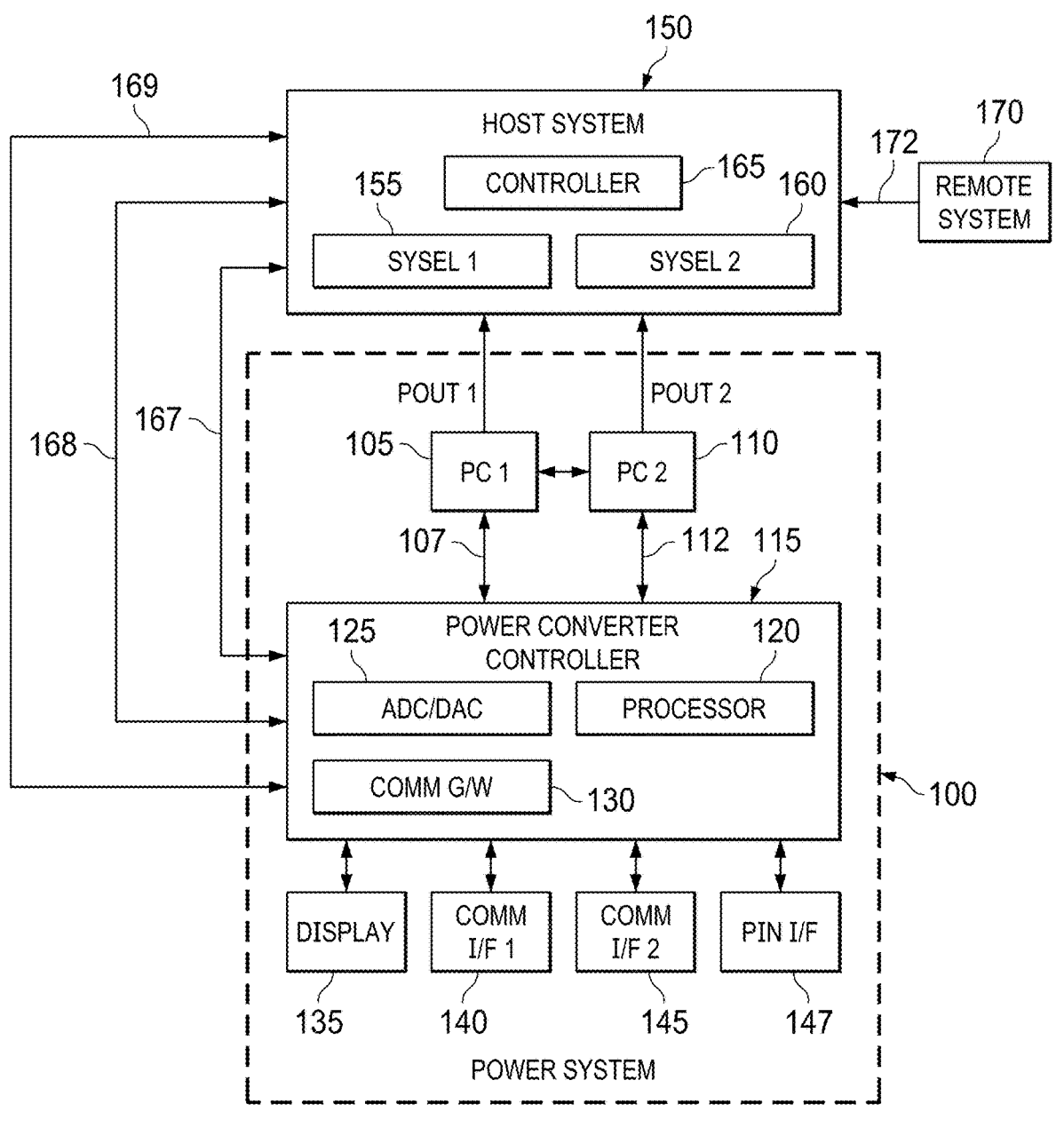
FIG. 1 illustrates a block diagram of an embodiment of a power system formed with a plurality of power converters controlled by a power converter controller.

Turning now to FIG. 1, illustrated is a block diagram of an embodiment of a power system 100 formed with a plurality of power converters (designated "PC 1, PC 2") 105, 110 controlled by a power converter controller 115. The power converters 105, 110 may be like or different power converter topologies. Also, ones of the power converters 105, 110 may be positioned at different locations. While only two power converters 105, 110 are illustrated, the power system 100 can include additional power converters depending on the application.

The power converter controller 115 includes a processor 120 (e.g., a microprocessor), an analog-to-digital converter/digital-to analog converter ("ADC/DAC") 125 and a communications gateway (designated "COMM G/W") 130. The power converter controller 115 includes local interfaces such as a display 135 (e.g., a touch screen display). The local interfaces may also include a first communications interface (designated "COMM I/F 1") 140 such as a USB interface for communications with an external device. The local interfaces may also include a second communications interface (designated "COMM I/F 2") 145 such as secure digital ("SD") interface for, without limitation, inputting control parameters for the power system 100, updating firmware of the power converter controller 115, and/or logging power system data. Of course, the power converter controller 115 may include additional local interfaces depending on the application. For instance, the power converter controller 115 will include an input power interface (designated "PIN I/F") 147 to provide input power thereto from a power bus (e.g., a 24 volt power bus). The input power interface 147 can communicate a status and/or an operational condition of power-related items such as circuit breakers, disconnect contactors, power monitors, etc.

The power system 100 powers a host system 150. The host system 150 includes a plurality of system elements (designated "SYSEL 1, SYSEL 2") 155, 160 and a host system controller 165. While only two system elements 155, 160 are illustrated, the host system 100 can include additional system elements depending on the application. The host system 150 is coupled to a remote system 170 via a communication path 172. Of course, the host system 150 may be coupled to additional remote systems depending on the application.

The power converter controller 115 can communicate with the host system 150 over a plurality of buses. The power converter controller 115 can communicate with the host system 150 using a host system protocol over the plurality of buses. For instance, the host system 150 can provide host system signals including status information about the system elements and control command information to the power converter controller 115 over a discrete analog bus 167 and/or a serial digital bus 168. The host system signals may include discrete, real-time, analog and/or digital input signals and output signals. Conversely, the power converter controller 115 can provide power system signals including status and control information to the host system 150 with respect to the system elements 155, 160 over the discrete analog bus 167 and/or the serial digital bus 168. The power system signals may include, without limitation, power system output voltage, output current, temperature and/or status of the input power, as well as other power or host system monitoring information. The discrete analog bus 167 and/or the serial digital bus 168 are coupled to the ADC/DAC 125 of the power converter controller 115.

Additionally, the host system 150 can provide host system signals including status and control information with respect to the host system controller 165 to the power converter controller 115 over a controller bus 169 (e.g., a serial digital bus). Conversely, the power converter controller 115 can provide power system signals including status and control information to the host system 150 with respect to the host system controller 165 over the controller bus 169. The power system signals may include, without limitation, power system output voltage, output current, temperature and/or status of the input power, as well as other power or host system monitoring information. The controller bus 169 is coupled to the communications gateway 130 of the power converter controller 115. Of course, the power converter controller 115 and host system 150 may communication over additional buses depending on the application.

The controller bus 169 can be utilized for near-real-time control of delivered power to the host system 150 to provide desired host system functionality. For example, the host system 150 may employ electronic heaters, where power to the heaters controls process temperature and this temperature can be varied to achieve desired results. There are many other examples where near-real-time control and reporting on delivered power would be beneficial to the host system 150. Another important consideration is host system control latency such as the delay between where a command is issued and where the power system 100 provides the desired response, or the delay between where the power system 100 delivers a command and when the power system reports the command to the host system controller 165. Modern host systems 150 often demand command and reporting latency as low as, for instance, one to five milliseconds for desired performance. The design of the power converter controller 115 takes into account these requirements. The power converter controller 115 (via, for instance, the communications gateway 130) can provide control and communications latency of less than five milliseconds (e.g., beneficially less than one millisecond).

The power converter controller 115 controls the power converters 105, 110 via buses such as serial digital buses 107, 112, respectively. The power converters 105, 110 provide power (designated "POUT 1, POUT 2, respectively) to the system elements 155, 160 of the host system 150.

The power converter controller 115 provides a status of and controls the power converters 100, 110 and at least one system element 155, 160 of the host system 150 responsive to the host system signals. The control may include a scripted sequence of events from the processor 120 as function of a change of an operational condition of at least one of the power converters 105, 110 and the host system 150. The status of the power converters 105, 110 and at least one system element 155, 160 of the host system 150 may be displayed on the display 135. In addition to monitoring at least one system element 155, 160 of the host system 150, the power converter controller 115 can monitor a status of and control the remote system 170 as well.

As an example, the power system controller 115 can provide a scripted sequence of events (or responses) related to a safety system (a system element 155, 160 or remote system 170) associated with the host system 150. The scripted sequence of events can be related to, for example, an emergency power cutoff contactor (a system element 155, 160 or remote system 170) that cuts off power to the host system 150, as well as interlocks (a system element 155, 160 or remote system 170) that are outside the power system 100. Host system signals (that apply to the system elements 155, 160 and remote systems 170) can be routed to the power converter controller 115 for the scripted sequence of events to control the power converters 105, 110, the host system 150 and/or the remote system 170. As further examples, the system element 155, 160 may include, without limitation, a leak detector, and/or a temperature sensor that can be controlled by the power converter controller 115.

Thus, the power converter controller 115 can be configured to operate as a central control point for power and system management. As non-limiting examples, other system sensor signals such as air conditioner monitor signals, contactor status signals, general relay board status signals, and signals that can prevent the power system 100 from powering on can also be coupled to the power converter controller 115 employing an appropriate protocol.

Figure 2:
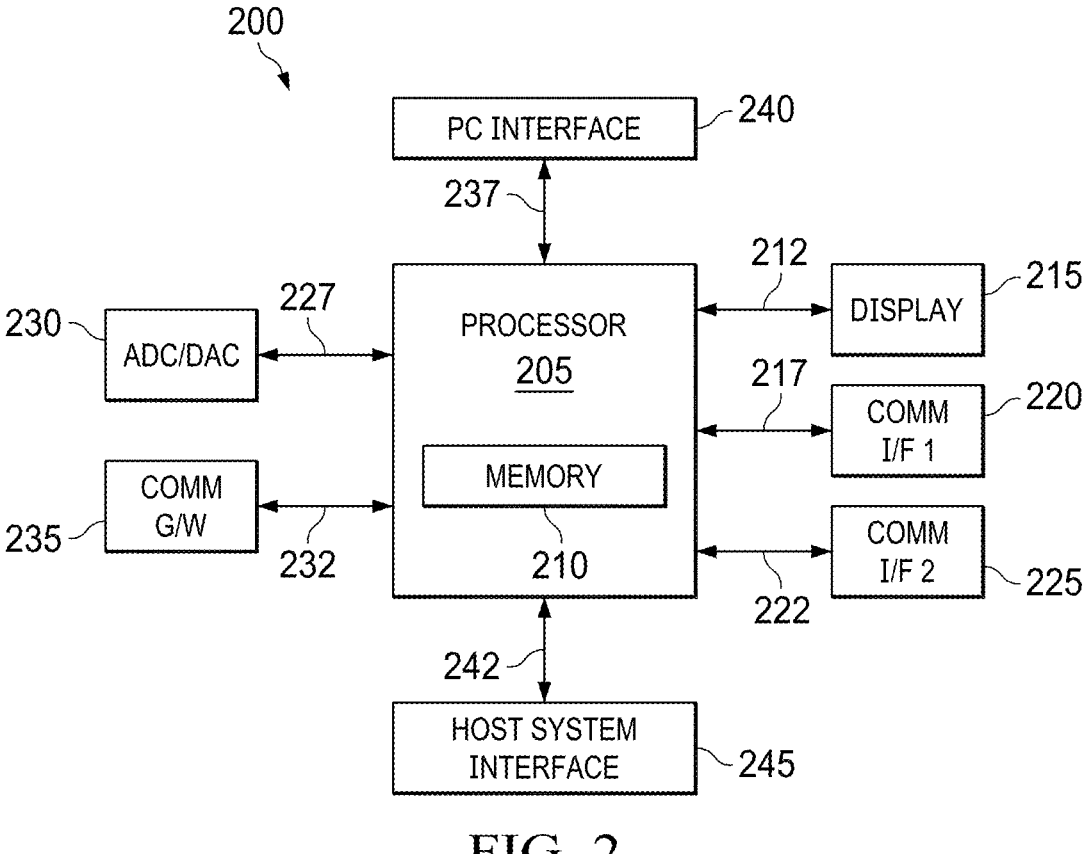
FIG. 2 illustrates a block diagram of an embodiment of portions of a power converter controller of a power system.

Turning now to FIG. 2, illustrated is a block diagram of an embodiment of portions of a power converter controller 200 of a power system (see, e.g., FIG. 1). As illustrated in FIG. 2, a processor 205 (e.g., a microprocessor) is utilized as a communications and control hub. This includes communications with a host system via, for instance, Ethernet, CANbus, USB, or an isolated low voltage discrete signal ("LVDS") serial peripheral interface bus ("SPIbus"). An LVDS SPIbus provides a fast, robust, and relatively noise-immune communication link. When an SPIbus is utilized, a third party communications bridge, such as the HMS Anybus product, can be implemented to support other host communication protocols, such as Ethernet, Ethercat, Profinet, CANbus, RS232, I2C, USB, or others.

Power system internal communications can be accomplished via CANbus to connected power converters, or via discrete digital and/or analog signals, as appropriate. Discrete input/output ("I/O") ports can also be used for host system communication and control, as desired or needed. The processor 205 can also interface to a display 215 (e.g., a touch screen display) for local, manual control of the power system.

The processor 205 in conjunction with memory 210 (e.g., embedded memory such as electrically erasable programmable read-only memory ("EEPROM")) provides real-time operating system control, as well as serving as a repository of various system control algorithms, wherein a plurality of power converter can be amalgamated into a single entity from control and reporting standpoints. Likewise, various operational scripts (scripted sequence of events or responses) can be implemented, such as controlling startup, shutdown, sequencing, control limits, as well as other parameters, of the power system and host system.

FIG. 2 illustrates example inputs and outputs of the power converter controller 200 demonstrating communication with, for instance, power system components, the host system, and remote systems. A display bus 212 (e.g., I2C external bus interface parr bus) provides communication with the display 215. A first communications interface bus 217 provides communication with a first communications interface (designated "COMM I/F 1") 220. For the example of FIG. 1, a USB bus (the first communications interface bus 217) provides communication with a USB interface (the first communications interface 215) for a USB device (an external device). A second communications interface bus 222 provides communication with a second communications interface (designated "COMM I/F 2") 225. For the example of FIG. 1, an SD bus (the second communications interface bus 222) provides communication with an SD interface (the second communications interface 225) for an SD card.

An ADC/DAC bus 227 (e.g., an SPIbus) provides communication with an ADC/DAC 230. A communications gateway bus 232 (e.g., a serial digital bus) provides communication with a communications gateway (designated "COMM G/W") 235. A power converter bus 237 (e.g., a serial digital bus, CANbus) provides communication with a power converter interface (designated "PC INTERFACE") 240. A host system bus 242 (e.g., a CANbus) provides communication with a host system interface 245 for, without limitation, system elements of the host system or a remote system. Of course, other buses and interfaces are well within the scope of the present disclosure.

Figure 3:
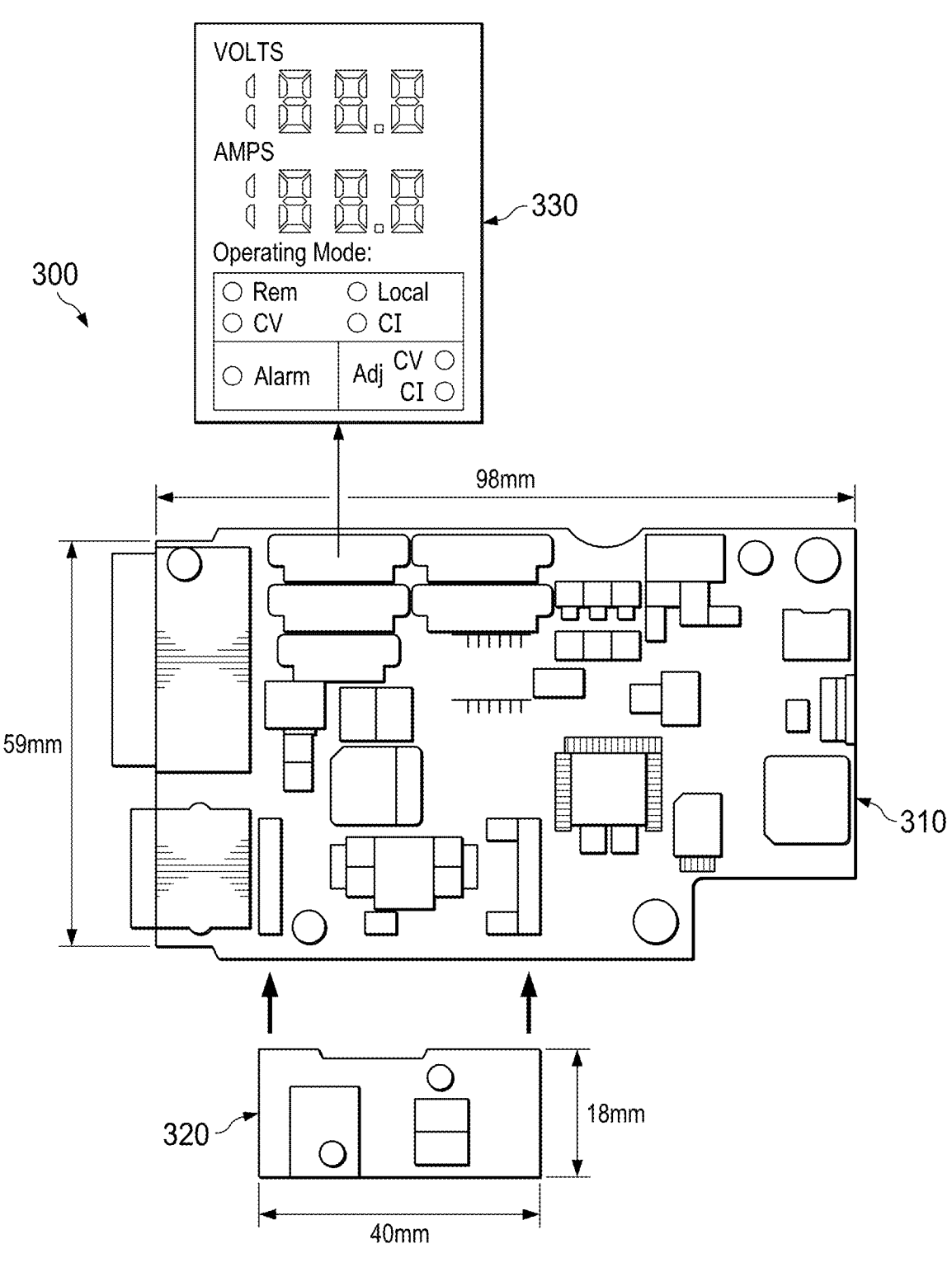
FIG. 3 illustrates a drawing of an embodiment of a physical representation of a printed circuit board assembly to construct at least portions of a power system including a power converter controller.

Turning now to FIG. 3, illustrated is a drawing of an embodiment of a physical representation of a printed circuit board assembly 300 to construct at least portions of a power system including a power converter controller. A processor (e.g., a microprocessor) and physical input/output ("I/O") interfaces/ports are constructed, as an example, on a 59 millimeter ("mm") by 98 mm main printed circuit board 310. A communication gateway located on a 40 mm by 18 mm printed circuit board 320 plugs into the main printed circuit board 310. Similarly, a display 330 (e.g., a touch screen display) is also connected to the main printed circuit board 310.

Other physical realizations are available outside of those shown in FIG. 3, such as a combination of the processor and I/O interfaces into a single printed circuit board assembly. The individual assemblies can be configured either separately or in tandem to provide various levels of power system control and reporting.

Figure 4:
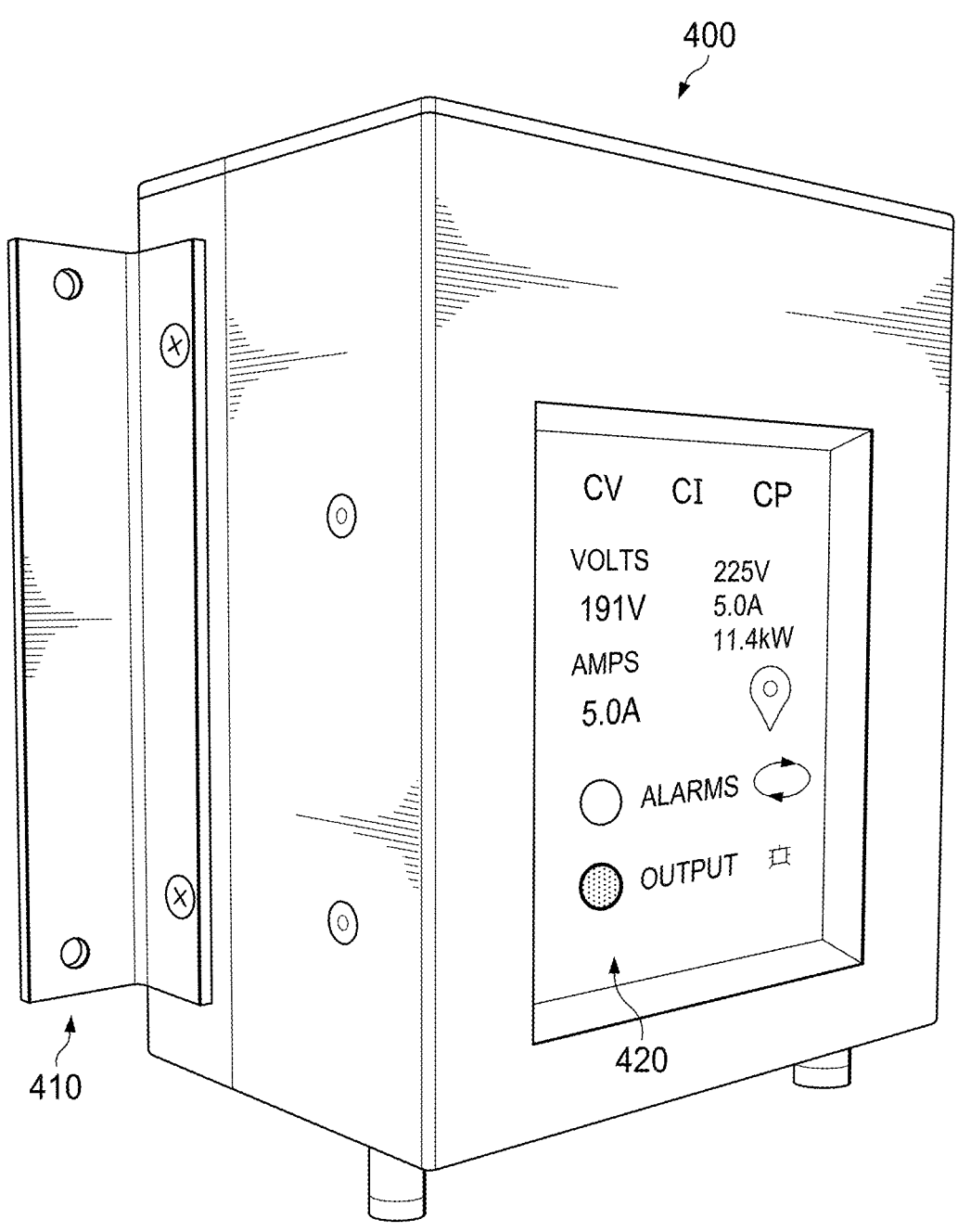
FIG. 4 illustrates a drawing of an embodiment of a physical representation of a power converter controller formed as a stand-alone assembly.

Turning now to FIG. 4, illustrated is a drawing of an embodiment of a physical representation of a power converter controller formed as a stand-alone assembly 400 such as in a plastic or metallic box. The stand-alone assembly 400 can be mounted to a structure via a bracket 410. The stand-alone assembly 400 also includes a display 420 (e.g., a touch screen display) to provide a visual representation of the operation of the power converter controller, a plurality of power converters, system elements and host system controller of the host system and/or remote systems.

Figure 5:
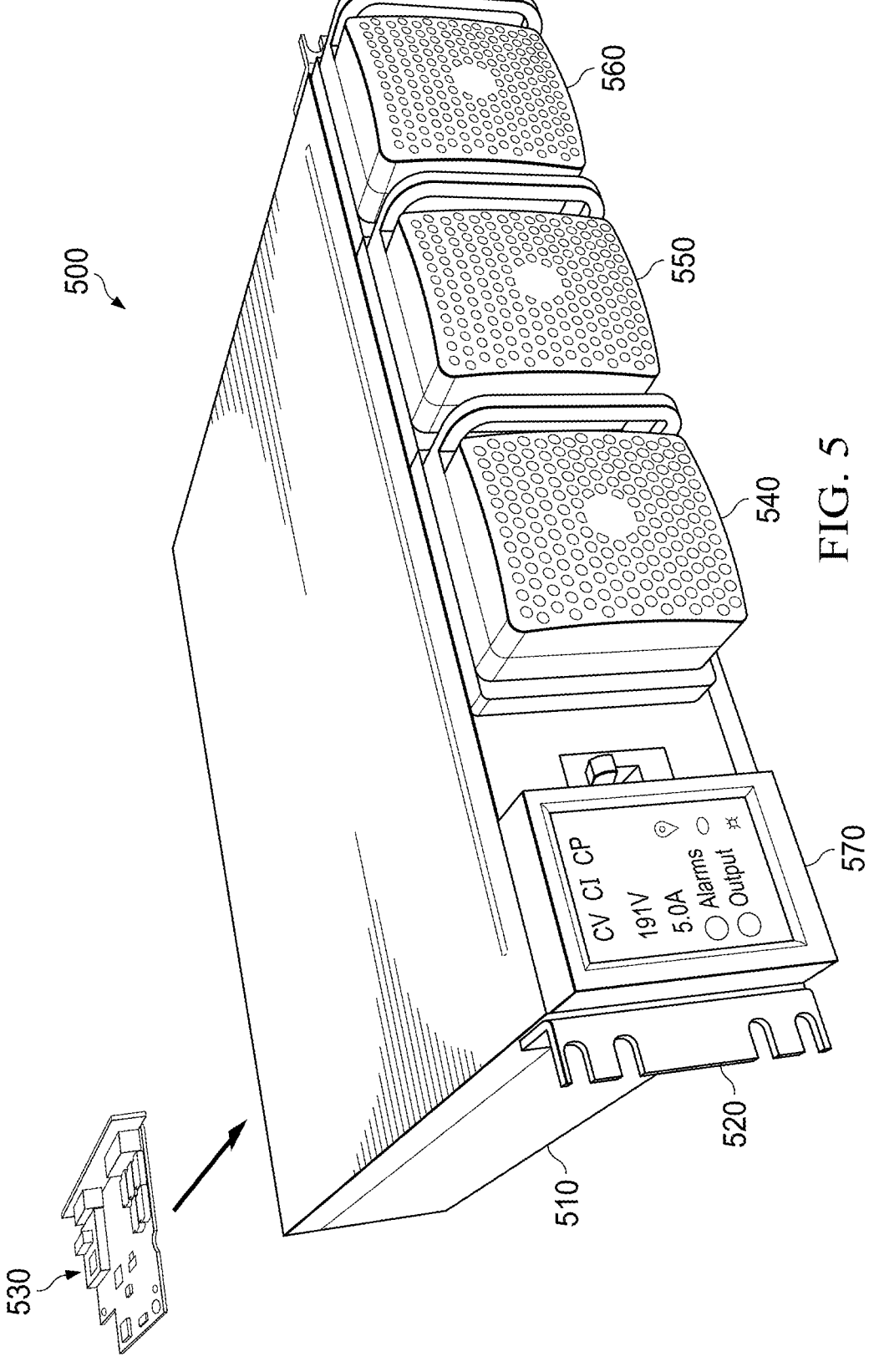
FIG. 5 illustrates a drawing of an embodiment of a physical representation of a power system integrated into a chassis.

Turning now to FIG. 5, illustrated is a drawing of an embodiment of a physical representation of a power system 500 integrated into a chassis 510 for, as an example, shelf mounting by a bracket 520. The power system 500 includes a power converter controller represented by a printed circuit board assembly 530. The power system 500 also includes a plurality of power converters 540, 550, 560, which can be replaceable based on, without limitation, application changes and/or performance deterioration. The power system 500 also includes a display 570 (e.g., a touch screen display) to provide a visual representation of the operation of the power converter controller, a plurality of power converters, system elements and host system controller of the host system and/or remote systems. The power system 500 can also serve as a hub for a safety management system.

The power system 500 can also implement a digital protocol to monitor and administer system safety circuits. This implementation can include dual redundant input power disconnect contactors, as well as input voltage monitoring, temperature sensing, interlock loops, an emergency machine off ("EMO") interface, coolant leak sensing, coolant control, key switches, door monitors, and others. With proper component selection, the power system 500 can meet requirements of various standards presented hereinbelow in TABLE 1.

Figure 6:
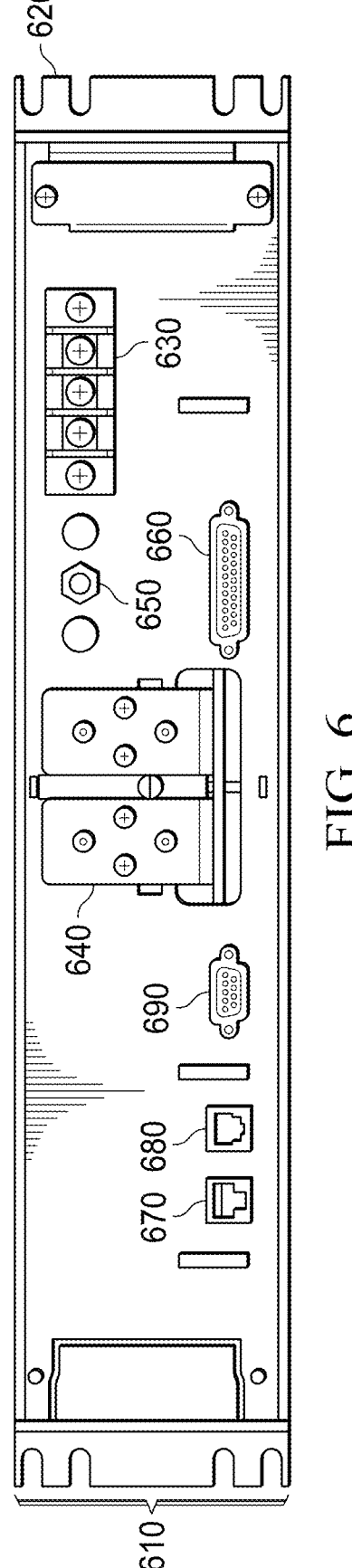
FIG. 6 illustrates a drawing of an embodiment of a physical representation of a backplane of a power system integrated into a chassis.

Turning now to FIG. 6, illustrated is a drawing of an embodiment of a physical representation of a backplane 610 of a power system 600 integrated into a chassis 620. As described above, the power system 600 includes a power converter controller and a plurality of power converters, and can accommodate a plurality of interfaces. The power system 600 receives input power (e.g., AC input power) via an input power interface or port 630. The plurality of power converters provide an output power (e.g., DC output power) to a host system via output power interfaces or ports (one of which is designated 640). The power system 600 also includes a ground interface or stud 650.

The power system 600 can receive host system signals (analog signals) including status and control information with respect to the host system including system elements thereof, a host system controller, and remote systems over an analog bus via an analog interface or port 660 (e.g., a DB25 analog control interface). Conversely, the power system 600 can provide power system signals (analog signals) including status and control information to the host system over the analog bus via the analog interface or port 660.

The power system 600 can receive host system signals including status and control information with respect to the host system including the system elements thereof, the host system controller, and the remote systems over an Ethernet bus via an Ethernet interface or port 670. Conversely, the power system 600 can provide power system signals including status and control information to the host system over the Ethernet bus via the Ethernet interface or port 670.

The power system 600 can receive host system signals including status and control information with respect to the host system including the system elements thereof, the host system controller, and the remote systems over first and second CANbus buses via first and second CANbus interfaces or ports 680, 690. Conversely, the power system 600 can provide power system signals including status and control information to the host system over the first and second CANbus buses via first and second CANbus interfaces or ports 680, 690.

Figure 7:
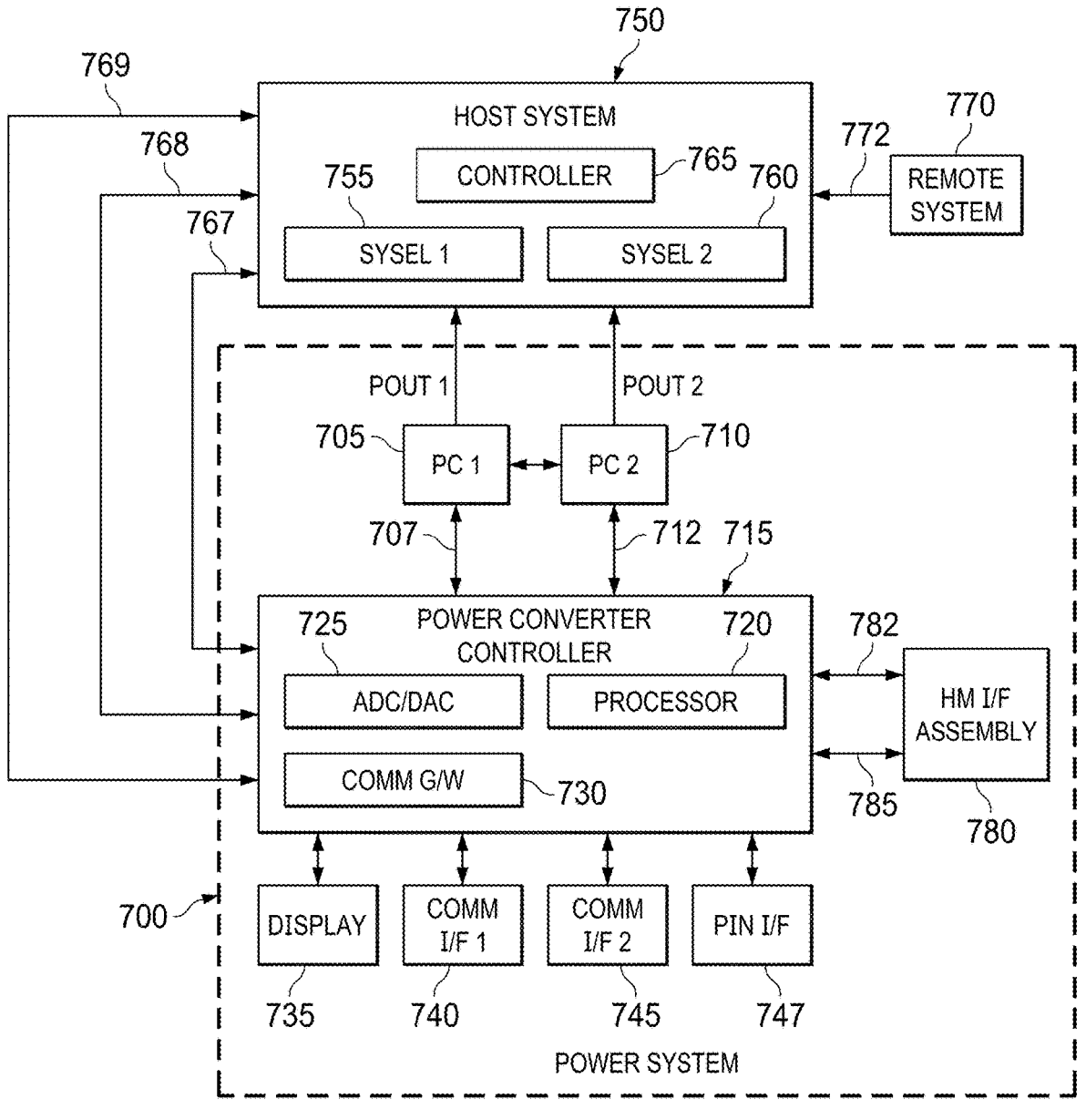
FIG. 7 illustrates a block diagram of an embodiment of a power system formed with a plurality of power converters controlled by a power converter controller.

Turning now to FIG. 7, illustrated is a block diagram of an embodiment of a power system 700 formed with a plurality of power converters (designated "PC 1, PC 2") 705, 710 controlled by a power converter controller 715. The power converters 705, 710 are analogous to the power converters 105, 110 described above with respect to FIG. 1.

The power converter controller 715 includes a processor 720 (e.g., a microprocessor), an analog-to-digital converter/digital-to analog converter ("ADC/DAC") 725 and a communications gateway (designated "COMM G/W") 730. The power converter controller 715 includes local interfaces such as a display 735 (e.g., a touch screen display), a first communications interface (designated "COMM I/F 1") 740, and a second communications interface (designated "COMM I/F 2") 745. Of course, the power converter controller 715 may include additional local interfaces depending on the application. For instance, the power converter controller 715 will include an input power interface 747 to provide input power thereto from a power bus (e.g., a 24 volt power bus). The aforementioned components and interfaces are analogous to the like components and interfaces described above with respect to FIG. 1.

The power system 700 powers a host system 750. The host system 750 includes a plurality of system elements (designated "SYSEL 1, SYSEL 2") 755, 760 and a host system controller 765. While only two system elements 755, 760 are illustrated, the host system 700 can include additional system elements depending on the application. The host system 750 is coupled to a remote system 770 via a communication path 772. Of course, the host system 750 may be coupled to additional remote systems depending on the application.

The power converter controller 715 can communicate with the host system 750 over a plurality of buses. The power converter controller 715 can communicate with the host system 750 using a host system protocol over the plurality of buses. For instance, the host system 750 can provide host system signals including status information about the system elements and control command information to the power converter controller 715 over a discrete analog bus 767 and/or a serial digital bus 768. The host system signals may include discrete, real-time, analog and/or digital input signals and output signals. Conversely, the power converter controller 715 can provide power system signals including status and control information to the host system 750 with respect to the system elements 755, 760 over the discrete analog bus 767 and/or the serial digital bus 768. The power system signals may include, without limitation, power system output voltage, output current, temperature and/or status of the input power, as well as other power or host system monitoring information. The discrete analog bus 767 and/or the serial digital bus 768 are coupled to the ADC/DAC 725 of the power converter controller 715.

Additionally, the host system 750 can provide host system signals including status and control information with respect to the host system controller 765 to the power converter controller 715 over a controller bus 769 (e.g., a serial digital bus). Conversely, the power converter controller 715 can provide power system signals including status and control information to the host system 750 with respect to the host system controller 765 over the controller bus 769. The power system signals may include, without limitation, power system output voltage, output current, temperature and/or status of the input power, as well as other power or host system monitoring information. The controller bus 769 is coupled to the communications gateway 730 of the power converter controller 715. Of course, the power converter controller 715 and host system 750 may communication over additional buses depending on the application.

The power converter controller 715 controls the power converters 705, 710 via buses such as serial digital buses 707, 712, respectively. The power converters 705, 710 provide power (designated "POUT 1, POUT 2, respectively) to the system elements 755, 760 of the host system 750. For a better understanding of the interactions between the power system 700, host system 750 and remote system 770, see the description above with respect to like components of FIG. 1.

The power converter controller 715 may also be coupled to a human-machine interface assembly (designated "HM I/F ASBLY") 780 via a discrete analog bus 782 and/or a serial digital bus 785. The human-machine interface assembly 780 can be configured to provide communication pathways for various system control signals such as such as discrete interlock signals between system elements 755, 760, emergency machine off controls, audible or visual alarms, etc. This further enables the power converter controller 715 to act as a central safety and system management point responsive to an event such as a fire or an accident, possibly even an injury of a person. This also facilitates the inclusion of interlocks that may be configured to prevent personnel from having access to certain sensitive system elements 755, 760 such as a high-voltage power conductor.

The human-machine interface assembly 780 can be implemented alongside other interfaces of the power converter controller 715. This provides the ability to configure a fault-tolerant power system control process in compliance with safety standards such as shown below in TABLE 1.

TABLE 1

| Standard ID | Description |
|---|---|
| UL508 | Industrial Control Equipment |
| CSA 22.2 No 14-13 | Industrial Control Equipment |
| EN 12100 | Safety of Machinery- General Principles for Design. Risk Assessment and Risk Reduction |
| EN 60204-1 | Safety of Machinery, Electrical Equipment for Industrial Machines |
| EN 13849-1 | Safety of Machinery - Safety Related Parts of Control Systems |
| EN 62061 | Safety of Machinery. Functional Safety of Safety Related Electrical, Electronic and Programmable Electronic Control Systems |

Turning now to FIG. 8, illustrated is a flow diagram of an embodiment of a method 800 of operating a power system. When describing the method 800 of operating the power system (e.g., the power system 700 of FIG. 7), the description of the method 800 below will refer to representative FIGURES above with corresponding reference numbers of the features described in accordance therewith. The method 800 begins at a start step or module 810. At a step or module 820, the method 800 includes receiving a plurality of host system signals from a host system at a power converter controller. (See, e.g., FIG. 7, a power converter controller 715 and a host system 750.) The power converter controller may include a communications gateway to communicate with a host system controller of the host system. (See, e.g., FIG. 7, a communications gateway 730 of the power converter controller 715, and a host system controller 765 of the host system 750.) The plurality of host system signals may include discrete, real-time, analog and/or digital input signals and output signals.

At a step or module 830, method 800 includes providing a status of and control a plurality of power converters and at least one system element of the host system responsive to the plurality of host system signals with the power converter controller. (See, e.g., FIG. 7, a plurality of power converters 705, 710, the power converter controller 715, and at least one system element 755, 760 of the host system 750.) The control may include a scripted sequence of events as function of a change of an operational condition of at least one of the plurality of power converters and the host system. The power converter controller may communicate with the host system using a host system protocol.

At a step or module 840, the method 800 includes powering the host system with the plurality of power converters in accordance with the control provided by the power converter controller. The power converter controller and the host system may communicate over a serial digital bus, and the power converter controller and the plurality of power converters may communicate over another serial digital bus. The plurality of power converters may be like or different power converter topologies. Also, ones of the plurality of power converters may be positioned at different locations.

At a step or module 850, the method 800 includes displaying the status of the plurality of power converters and at least one system element of the host system with a touch screen. (See, e.g., FIG. 7, display 735 associated with the power converter controller 715.) At a step or module 860, the method 800 includes communicating with an external device via, for instance, a communications interface such as a USB interface. (See, e.g., FIG. 7, a first communications interface 740 associated with the power converter controller 715.) At a step or module 870, the method 800 includes inputting, updating and/or logging information associated with the power system and host system via, for instance, a communications interface such as an SD interface. (See, e.g., FIG. 7, a second communications interface 745 associated with the power converter controller 715.) For instance, the method, in accordance with the step or module 870, may input control parameters for the power system, update firmware of the power converter controller, and/or log power system data. The method 800 ends at an end step or module 880.

The foregoing description of embodiments of the present proposed solutions have been presented for the purpose of illustration and description. It is not intended to be exhaustive or to limit the proposed solutions to the present form disclosed. Alternations, modifications and variations can be made without departing from the spirit and scope of the present proposed solution.

As described above, the exemplary embodiment provides both a method and corresponding apparatus consisting of various modules providing functionality for performing the steps of the method. The modules may be implemented as hardware (embodied in one or more chips including an integrated circuit such as an application specific integrated circuit), or may be implemented as software or firmware for execution by a processor. In particular, in the case of firmware or software, the exemplary embodiment can be provided as a computer program product including a computer readable storage medium embodying computer program code (i.e., software or firmware) thereon for execution by the computer processor. The computer readable storage medium may be non-transitory (e.g., magnetic disks; optical disks; read only memory; flash memory devices; phase-change memory) or transitory (e.g., electrical, optical, acoustical or other forms of propagated signals-such as carrier waves, infrared signals, digital signals, etc.). The coupling of a processor and other components is typically through one or more busses or bridges (also termed bus controllers). The storage device and signals carrying digital traffic respectively represent one or more non-transitory or transitory computer readable storage medium. Thus, the storage device of a given electronic device typically stores code and/or data for execution on the set of one or more processors of that electronic device such as a controller.

Although the embodiments and its advantages have been described in detail, it should be understood that various changes, substitutions, and alterations can be made herein without departing from the spirit and scope thereof as defined by the appended claims. For example, many of the features and functions discussed above can be implemented in software, hardware, or firmware, or a combination thereof. Also, many of the features, functions, and steps of operating the same can be reordered, omitted, added, etc., and still fall within the broad scope of the various embodiments.

Moreover, the scope of the various embodiments is not intended to be limited to the particular embodiments of the process, machine, manufacture, composition of matter, means, methods and steps described in the specification. As one of ordinary skill in the art will readily appreciate from the disclosure, processes, machines, manufacture, composition of matter, means, methods, or steps, presently existing or later to be developed, that perform substantially the same function or achieve substantially the same result as the corresponding embodiments described herein can be utilized as well. Accordingly, the appended claims are intended to include within their scope.

What is claimed is:

1. A power system, comprising:
a plurality of power converters configured to power a host system;
a power converter controller configured to provide a status of and control said plurality of power converters and at least one system element including a safety system in said host system responsive to a plurality of host system signals, said control including a scripted sequence of events as function of a change of an operational condition of said plurality of power converters and said safety system; and
an enclosed chassis containing said plurality of power converters and said power converter controller, said host system being located outside of said enclosed chassis.

2. The power system as recited in claim 1 wherein said power converter controller comprises a communications gateway to communicate with a host system controller of said host system.

3. The power system as recited in claim 1 wherein said power converter controller communicates with said host system using a host system protocol.

4. The power system as recited in claim 1 wherein said power converter controller and said host system communicate over a serial digital bus, and said power converter controller and said plurality of power converters communicate over another serial digital bus.

5. The power system as recited in claim 1 wherein said plurality of host system signals comprise discrete, real-time, analog and/or digital input signals and output signals.

6. The power system as recited in claim 1 wherein said plurality of power converters are formed with different power converter topologies.

7. The power system as recited in claim 1 further comprising a human machine interface assembly coupled to said power converter controller configured to provide a communication pathway for discrete interlock signals for said at least one system element, emergency machine off controls, and audible and visual alarms.

8. The power system as recited in claim 1 wherein said power converter controller comprises a touch screen on an exterior of said enclosed chassis configured to display said status of said plurality of power converters and said at least one system element of said host system.

9. The power system as recited in claim 1 wherein said power converter controller comprises a communications port for communications with an external device.

10. The power system as recited in claim 1 wherein said power converter controller comprises a data input port for inputting control parameters for said power system, updating firmware of said power converter controller, and logging power system data.

11. A method of operating a power system, comprising:
powering a host system with a plurality of power converters; and
providing a status and control of said plurality of power converters and at least one system element including a safety system in said host system responsive to a plurality of host system signals with a power converter controller, said control including a scripted sequence of events as function of a change of an operational condition of said plurality of power converters and said safety system, said plurality of power converters and said power converter controller being in an enclosed chassis and said host system being located outside of said enclosed chassis.

12. The method as recited in claim 11 further comprising communicating with a host system controller of said host system with a communications gateway of said power converter controller.

13. The method as recited in claim 11 further comprising communicating with said host system using a host system protocol.

14. The method as recited in claim 11 wherein said power converter controller and said host system communicate over a serial digital bus, and said power converter controller and said plurality of power converters communicate over another serial digital bus.

15. The method as recited in claim 11 wherein said plurality of host system signals comprise discrete, real-time, analog and/or digital input signals and output signals.

16. The method as recited in claim 11 wherein said plurality of power converters are formed with different power converter topologies.

17. The method as recited in claim 11 further comprising providing a communication pathway with a human machine interface assembly coupled to said power converter controller for discrete interlock signals for said at least one system element, emergency machine off controls, and audible and visual alarms.

18. The method as recited in claim 11 further comprising displaying said status of said plurality of power converters and said at least one system element of said host system with a touch screen on an exterior of said enclosed chassis.

19. The method as recited in claim 11 further comprising communicating with an external device.

20. The method as recited in claim 11, further comprising:
inputting control parameters for said power system;
updating firmware of said power converter controller; and
logging power system data.

* * * * *